United States Patent [19]

Loiseau et al.

[11] 4,070,264
[45] Jan. 24, 1978

[54] R. F. SPUTTERING METHOD AND APPARATUS

[75] Inventors: Michel Loiseau, Paris; Pierre Charles Pileur, Viry-Chatillon, both of France

[73] Assignee: International Business Machines Corporation, Armonk, N.Y.

[21] Appl. No.: 483,506

[22] Filed: June 27, 1974

[30] Foreign Application Priority Data

July 12, 1973 France ................... 73 26405

[51] Int. Cl.² .............................. C23C 15/00
[52] U.S. Cl. .................... 204/192 E; 204/298
[58] Field of Search .................. 204/192, 298

[56] References Cited

U.S. PATENT DOCUMENTS

| 3,507,248 | 4/1970 | Seeley et al. ............ 204/298 X |
| 3,763,031 | 10/1973 | Scow ........................ 204/298 |
| 3,844,924 | 10/1974 | Cunningham et al. ....... 204/298 |

OTHER PUBLICATIONS

Maissel et al., "Handbook of Thin Film Technology," McGraw Hill, N.Y. (1970), pp. 7-49 and 7-50.

Primary Examiner—Aaron Weisstuch
Attorney, Agent, or Firm—William J. Dick

[57] ABSTRACT

Disclosed is R.F. sputtering apparatus for etching the surface of an object, the apparatus comprising a vacuum chamber with the conventional vacuum creating means associated therewith as well as a pump for supplying an ionizable gas into the vacuum chamber. An R.F. power supply is connected to a plate like cathode electrode in the chamber, the plate including a plurality of object supports extending therethrough and including means for holding an object to be etched. A luminescent discharge area, including a Crooks dark space area has a thickness "$e$" surrounding the plate and the object being etched, the objects being etched being spaced one from the other by a distance "$d$"$\leq 2$"$e$". The objects being etched are also preferably supported a distance "$h$" from the cathode (plate) wherein "$h$"$\geq 2$"$e$" whereby ion bombardment of the cathode electrode during the sputter operation is inhibited. Also disclosed is a method for employing the above described apparatus.

11 Claims, 7 Drawing Figures

R. F. SPUTTERING METHOD AND APPARATUS

SUMMARY OF THE INVENTION AND STATE OF THE PRIOR ART

This invention relates to a method and apparatus for removing undesirable matter from material surfaces, and more particularly relates to a method and apparatus for removing undesirable material from the surface of semiconductor elements by R.F. sputtering.

In some applications, in particular in the manufacture of semiconductor elements, when conventional etching using chemical means is not completely satisfactory, it is possible to accomplish a more satisfactory etching by cathode or D.C. sputter etching. Even in these situations, it may be advantageous to sputter etch in combination with a chemical etch. When both techniques are successively used, chemical etching is performed first and removes a majority of the undesirable material to be removed. The chemical etch is then followed by a sputtering operation which removes the remaining portions of the undesirable material remaining on the surface to be cleaned.

In sputter etching, material is removed from an object by bombarding it with low energy ions directed through a mask defining the configuration to be etched in the object. In the most currently used cathode sputtering etching processes, the object to be etched is covered with a mask and placed in a low-pressure atmosphere of an inert gas such as Argon, the object and the mask being maintained at a negative D.C. potential which ionizes the gas atoms and establishes a space charge zone around the object and the mask. The space charge zone contains positive ions having low energy levels, which bombard the material through the mask to accomplish sputter etching.

The above described sputter etch process has the disadvantage of ion accumulation around the object to be etched after ion bombardment of the object. If ion charge is not neutralized, the accumulated ions will agglutinate on the object as a positively charged layer protecting the object during subsequent bombardment by the low energy ions of the space charge zone. Therefore, to continue the sputtering operation, it is necessary to neutralize the ions accumulating over the object to be etched. If the object to be etched is made from metal material, holding the metal at a negative potential appropriate to the sputtering, will cause the neutralization of the ions through the conduction of the electrons through the metal.

Alternatively if the object to be etched is a poor conductor or made from dielectric material, the neutralization may be performed by using a metal mask held at the negative potential required for the sputtering operation, so that the ions are neutralized by the conduction of the metal mask electrons. However, the presence of this metal mask facilitates the formation of a "halo" of re-deposited dielectric material, conducting material issued from the mask and some material from apparatus adjacent the object which is cleaned by sputtering. The "halo" is undesirable since it can short-circuit the surface and be detrimental to subsequent welding steps. In addition, this charge neutralizing technique involves the maintenance of a large conducting surface exposed to ion bombardment at a negative potential through an electrical connection to an external source of electric power. In many applications, this is not possible and in some other applications, this is not desirable.

To overcome these disadvantages, it has been proposed to place the object to be etched in a low pressure atmosphere of inert gas and to energize it by an R.F.A.C. potential which establishes a discharge around the object. The A.C. potential enables the maintenance of a continuous electric field at the level of the isolating cathode made from a poor conducting material or from a dielectric material. During the positive periods, the electrons are attracted towards the target neutralizing the positive ions accumulating around the object during the sputter etching operation.

Therefore, etching by R.F. sputtering is performed without accumulation of positive charges around the etched object. It is not necessary to maintain a large conducting surface at a negative potential with an electrical connection to an external source of electric power. Thus, dielectric surfaces can be rapidly cleaned by R.F. sputtering. Theoretically, it is possible to remove tiny amounts of dielectric material from small holes which have been chemically etched, the small holes being able to be used as a location for an electrical contact for the semiconductor elements.

The prior art devices using R.F. sputtering display the disadvantage of an undesirable re-deposit or parasitic deposit on the workpiece because the ion bombardment also etches the support of the objects to be etched, the support being used as a cathode. Therefore, a re-deposit of the substances forming the support is formed on the object to be etched. In addition to preventing a perfect cleaning of the surfaces of the object to be etched and the formation of a source of contamination, the prior art R.F. sputtering devices bar those R.F. sputtering processes when inter-metallic contacts, such as the ones used in the multi-level metallization of semiconductor devices, are to be formed.

The present invention overcomes the foregoing disadvantage by an improved R.F. sputtering process and apparatus enabling improved etching and cleaning of object surfaces. By the apparatus and process of the present invention it is possible to perform a cleaning operation just prior to an evaporation or a deposit operation.

In view of the above, it is an object of the present invention to provide an improved R.F. sputtering method and apparatus to effect a uniform and monitored removal of contaminating or undesirable material located on a selected surface zones of workpieces, especially semiconductor wafers.

Another object of the present invention is to provide a novel method which inhibits the accumulation of electric charges across the surface of the object to be etched.

Another object of the present invention is to provide a novel method which eliminates contaminating material located on small selected surface zones of a material while uniformly monitoring the etching of the adjacent zones.

Another object of this invention is to provide novel R.F. sputtering apparatus which permits sputter cleaning of sufficient efficiency so that the cleaning step may be followed by an evaporation step without necessitating intermediate steps.

Still another object of the present invention is to provide a novel method for etching a semiconducting surface, in which the surface is first subjected to a chemical etch, then to an R.F. sputter etch, this last step being carried out just prior to an evaporation step.

Yet another object of the present invention is to provide novel R.F. sputtering apparatus which avoids the re-deposit or parasitic deposit of material from the support of the objects to be etched and thus provides well cleaned contact holes usable in multi-level metallization used in semiconductor technology.

In accordance with the present invention, the objects to be etched by sputtering are placed in a low pressure atmosphere of inert gas. An R.F. A.C. potential is applied to establish a space charge zone around the objects, the objects being positioned on supports arranged on a base support plate so that the surface of the objects to be etched is located at a predetermined distance from the surface of the base support plate and the zones of the base support plate surrounding the object supports and the objects to be etched are protected against the ion bombardment by the dark space zone.

In accordance with another principle of this invention, the apparatus is designed to be used with a method successively used to clean, by sputtering, parts of selected surfaces of an object to be etched, then to evaporate a material on the cleaned surface parts of the object. The process includes the steps of emptying a chamber in which there is at least one object to be etched and for introducing an ionizable gas in the chamber. The gas is then ionized and accelerated towards the objects to sputter clean selected surface parts on the objects. After sputter cleaning, the objects are heated, and a material is deposited on the selected surface parts of the objects.

Other objects, and a more complete understanding of the present invention may be had by referring to the following specification and claims taken in conjunction with the accompanying drawings in which:

FIGS. 2A to 2D enlarged fragmentary sectional views in cross section of an object to be etched and illustrating the various steps of the novel process of the present invention.

Figure 1:
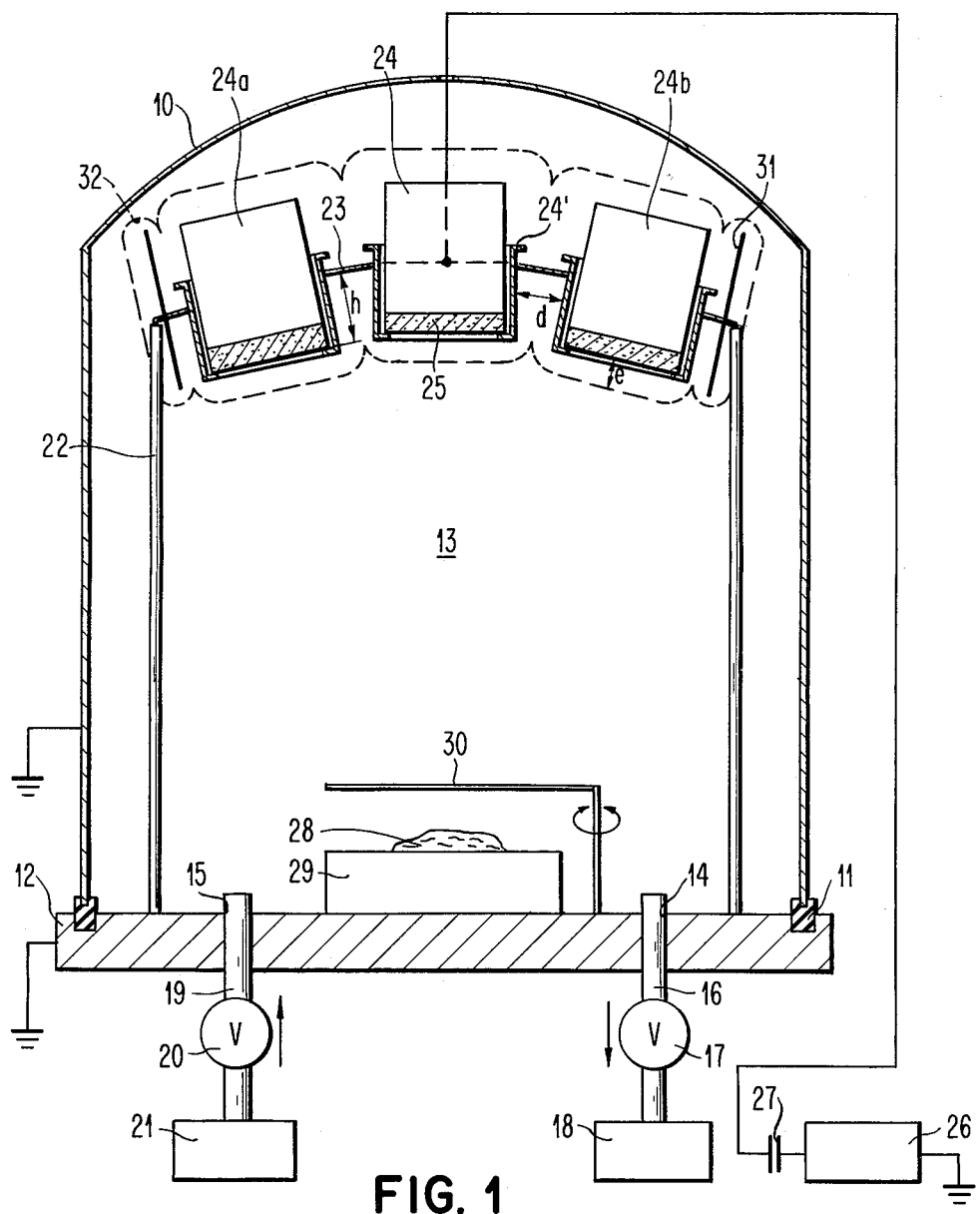
FIG. 1 is a cross sectional side elevation and schematic view of R.F. sputtering apparatus constructed in accordance with the present invention.

Referring now to the drawings, and especially FIG. 1 thereof, R.F. sputtering apparatus constructed in accordance with the present invention is illustrated therein. In accordance with the invention, R.F. sputtering is carried out in an inert and controlled atmosphere, to provide the surface of the material to be processed with the ions required by the sputtering action while avoiding contamination thereof. To this end, a vacuum shield, dome or chamber 10 is mounted on a support or base 12 by an "O" ring seal 11 which seals the vacuum chamber and support assembly. The vacuum chamber 10 contains an atmosphere 13 composed of an inert gas at low pressure on sputtering. The base 12 is provided with an outlet opening 14 through which controlled amounts of atmosphere 13 can be evacuated to reduce and maintain the internal pressure and with an inlet opening 15 through which an inert gas can be introduced into the vacuum chamber 10. Outlet 14 is connected through a conduit 16 and a regulating valve 17, to a vacuum pump 18, while inlet 15 is connected through a conduit 19 and a regulating valve 20 to a source of inert gas such as a tank 21.

Pillars 22 are secured to the support 12 and support a plate 23 which in the illustrated instance is of dome or spherical shape and which is provided with a plurality of openings in which are housed object holders 24'. The object holders include block supports 24 made of an insulating material such as glass e.g. "PYREX", it being understood that any other insulating material would be appropriate. The holders 24' for holding workpieces 25 to be etched such as semiconductor wafers, may be of a similar cross sectional geometry as the workpiece, in the present instance circular, and include inturned lip portion for supporting the wafer. The holders 24' as well as block supports are shown as generally projecting beyond dome 23 but it is obvious that said supports need only project beyond dome 23 on the side where the workpieces are mounted. Holders 24' may be of any appropriate form and nature as long as they hold objects 25 on supports 24.

As shown in FIG. 1 an impressed voltage from high frequency power supply 26 is applied to dome 23, the dome being mounted for rotation during the evaporation step in a manner well known in the art. One terminal of the power supply is connected to ground while the second terminal is connected through a conventional impedance matchmaker 27, to dome 23. Support 12 and also vacuum chamber 10 are grounded. Dome assembly 23 is used as a cathode during the sputtering step while support 12 is used as an anode.

Evaporation material 28 is placed on a platform 29 and will be used as an evaporation source during the evaporation step. A shutter 30 allows masking of the evaporation material when evaporation is not required. A source of heat (not shown) permits the bringing of the evaporation material to its evaporation temperature.

When sputtering or cleaning by ion bombardment, exposed or unmasked surfaces of semiconductor wafers 25, atmosphere 13 is comprised of a low pressure inert gas, preferably Argon at a pressure from $10^{-4}$ to $10^{-2}$ Torr. Atmosphere 13 is obtained by drawing a vacuum in bell jar 10 as by pump 18, and then supplying Argon into the vacuum bell jar through conduit 19 until the required pressure is obtained.

It is to be noted that any inert gas can be used to create atmosphere 13 but argon is more satisfactory since the mass of the argon ions is relatively greater than the one of the other inert gases, which increases the sputtering effect.

After the proper internal atmospheric pressure 13 has been obtained, and shutter 30 is positioned to mask material 28, H.F. voltage source 26 which varies from 1.5 to 2 kW at 13.5 MHz, is switched on, atmosphere 13 ionizes and the argon ions bombard the cathode formed by dome 23, block supports 24 and wafers 25 by defining a luminescent discharge which includes a Crooks dark space area around the cathode as defined by dashed line 32. The dark space area has a thickness "e" which is directly proportional to the mean free path of the electrons, therefore inversely proportional to the argon pressure in the vacuum chamber. Thus, it is relatively easy to determine the thickness "e".

In the sputtering devices of the Prior Art, the argon ions impinge upon the entire dome 23, causing a sputtering of the dome which emits secondary particles which settle on wafers 25. In this instance it is difficult to achieve proper sputtering inasmuch as the wafer surface will be contaminated by particles dispelled from the dome bombardment. To overcome this disadvantage, it is desirable to provide a configuration of the dome and of the wafer block supports 24 which avoids dome bombardment. This configuration should be such that the areas of the dome surrounding wafers 25 are preserved from the ion bombardment by the dark space area. To obtain this result, distance "$d$" separating adjacent wafer holders 24' or block supports 24 should be such that $d \leq 2e$. Thus, the argon ions will have lost a great part of their energy when they will reach dome 23 and the sputtering of the dome will be considerably reduced. To increase this loss of energy and to avoid any contamination of the surfaces of wafers 25 by the particles which can be issued from the reduced sputtering of the dome, it is desirable that a distance "$h$" separates the support surface of the wafers from the surface of the dome. The distance "$h$" will be preferably selected as exceeding "$2e$" so that the dome is effectively preserved from the ion bombardment by the dark space area. With the above indicated pressure and voltage conditions, the following dimensions have been successfully employed: $d \approx 3$ to 5mm and $h \approx 20$mm ($e$ being approximately equal to 9mm).

As shown on FIG. 1, block supports 24 positioned on the dome, are provided with two surfaces approximately parallel to the surface of the dome and situated on opposite sides thereof and at a predetermined distance therefrom. As explained above, the surface supporting wafer 25 is situated at a distance $h$ from the surface of the dome. The second surface is also situated at a certain distance from the dome to avoid any ion bombardment of the upper surface of the dome when a sputtering step is carried out. Thus, the dark space area protects the upper part of the dome.

Figure 1A:
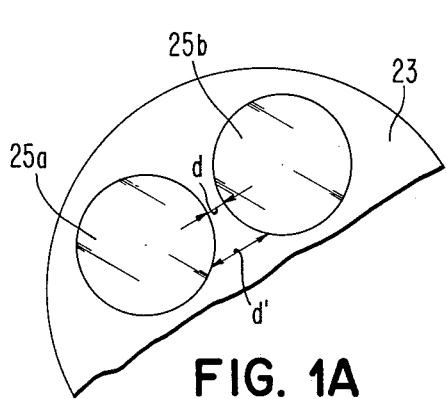
FIGS. 1A and 1B are fragmentary schematic plan views of a support base plate with its object supports removed for clarification, in accordance with the present invention.

The prior art teaches that the distance "$d$" separating two adjacent wafer holders 24' or block supports 24 cannot be less than $2e$, "$e$" being the thickness of the dark space area. This condition can be obtained without difficulty when the surface of the blocks supporting wafer 25 has a simple geometrical shape and includes only straight lines (square, rhombus, rectangle, etc.). However, when the surface of the wafer and the surface of the block exhibit a more complicated shape, as a round shape for example, then it is necessary to provide closer spacing so that "$d$" cannot exceed $2e$. Thus, as shown on FIG. 1A, wafers 25a and 25b cannot be separated by a distance "$d$" exceeding $2e$. This requires that the minimum distance "$d$" separating wafers 25a and 25b be distinctly less than $2e$ ($d = 3$mm in the above example).

Figure 1B:
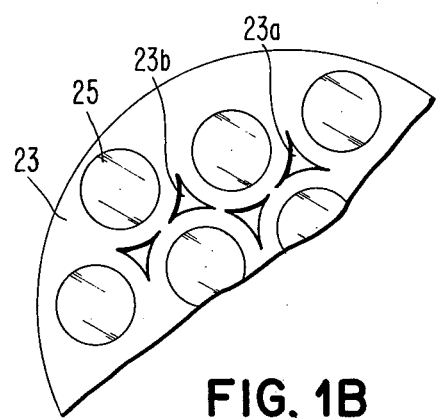

Another embodiment is shown on FIG. 1B and to be used when, for manufacturing purposes, distance "$d$" must be relatively large. Under these circumstances, it is possible that distance $d$ may exceed $2e$ and therefore, some areas of the dome are subjected to ion bombardment. To avoid this bombardment, dome 23 may be provided with apertures having a curvilinear triangle configuration such as holes 23a and 23b. Moreover, even when the maximum distance "$d$" between two adjacent blocks is less than $2e$ a better result may be obtained by providing such apertures in dome 23.

When sputtering wafers, it is necessary that the whole surface of the wafers be uniformly bombarded to prevent some areas of the surface from being overetched while other areas are under-etched. While the bombardment is effectively uniform over wafers which are situated near the center of the dome, such is not the case for the ones supported by blocks 24a and 24b which are installed adjacent the periphery of the dome. In effect the wafers supported adjacent the periphery, during the sputtering step, are submitted to an ion bombardment and to a spurious sputtering which causes contamination of the wafers installed on blocks 24a and 24b. To inhibit this bombardment, dome 23 is preferably provided with a circumferentially extending shield or screen 31 which completely surrounds the dome and avoids any sputtering of block supports 24.

Thus, by adapting the configuration of dome 23 and blocks 24 to the one of the gaseous plasma and of the dark space area, all spurious effects such as the undesirable sputtering of materials or the non-uniformity of the ion bombardment on the surfaces to be etched are overcome by the improved distribution of the electric field over all the wafers.

With sputtering apparatus such as described above, it is possible to obtain wafer surfaces which are perfectly cleaned and etched and then the sputtering may be directly followed by an evaporation step. During this last step which is conventional and well known in the art, evaporation material source 28 is heated by a device (not shown) and shutter 30 may be moved to unmask source 28. Wafers 25 will also be heated to make the deposit of evaporated material easier. The film which is deposited in this way on the whole surface of the chips will then be able, if required, to be etched to define a particular configuration in the film. During the evaporation step, dome 23 is submitted to a rotating movement through rotation control apparatus (not shown), such apparatus being conventional and well known in the art. The rotation of the dome permits the obtaining of a more uniform evaporation on the surface of wafers 25.

Figure 2A:
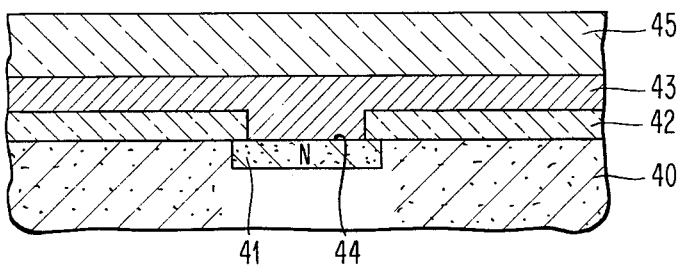
Figure 2B:
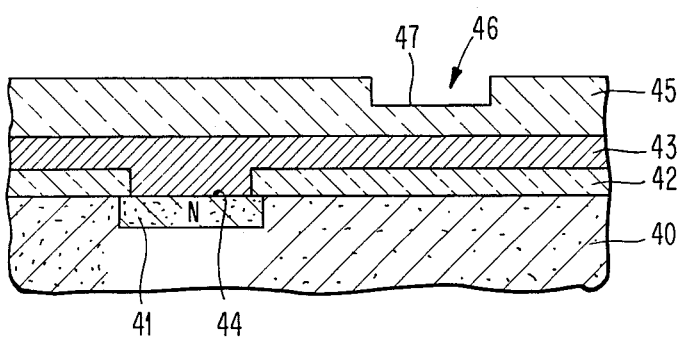

A conventional embodiment employing sputtering etching and evaporation in accordance with this invention, is shown on FIGS. 2A to 2D. This embodiment relates to metal multi-layer interconnections used for manufacturing integrated circuits. FIG. 2A schematically shows, at a given manufacturing step, a part of an integrated circuit of a semiconductor wafer. It is obvious that the chip includes a large number of identical or different semiconductor elements and that FIGS. 2A to 2D are schematic to give a better understanding of the invention.

Figure 2C:
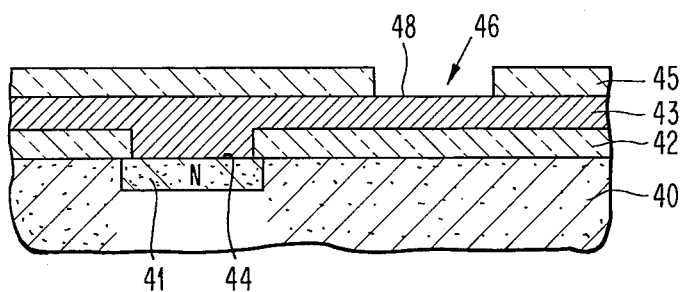
Figure 2D:
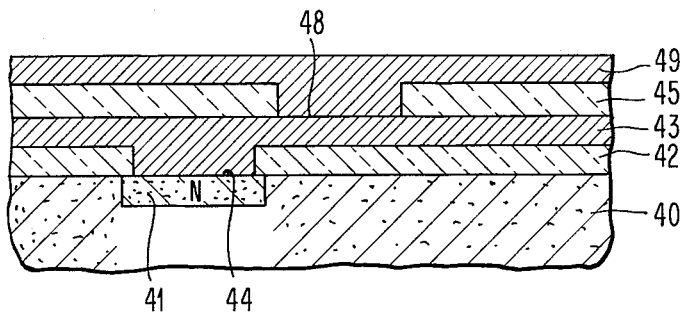

FIG. 2A shows a P type conductivity semiconductor substrate 40 including a diffused region 41 of N type conductivity. The N type region can form an element of a transistor or any other element of the integrated circuit. Substrate 40 may be covered with an insulating layer 42 such as $SiO_2$. In turn, the insulating layer is covered by a conducting metal layer 43, such as aluminum, in contact with region 41 on the whole surface of junction 44. The metal layer 43 is a first level layer which should contact, in a determined zone, a second level metal layer. For this purpose, metal layer 43 is covered with an insulating oxide layer 45. A first chemical etching is then carried out to etch insulating layer 45 and to form in it, a cavity 46 corresponding to the determined contact region (see FIG. 2B), bottom 47 of the cavity being located a predetermined distance from the upper surface of metal layer 43. Thereafter the sputtering step of the invention is carried out, the wafer with the semi-conductor element to be etched being installed on a block support 24 (FIG. 1). Sputtering is performed on the whole wafer, (in the illustration the chip) and more particularly on the whole oxide layer 45 and is carried on until the cavity comes in contact with metal layer 43 on the surface 48 (FIG. 2C). Sputtering is carried out for a period of time sufficient to remove completely all oxide waste of layer 45 from surface 48. It is obvious that the thickness of oxide layer 45 is reduced after the sputtering step, but the thickness can be easily predetermined as known by those skilled in the art.

As soon as the sputtering step is completed, an evaporation step as defined above, is carried out to deposit a conducting metal layer 49, made of aluminum for example, called "second level layer", on the first level layer 43, both layers being in contact through the entire surface 48. Then, other steps or operations may be carried out on the thus-treated semiconductor element, such operations not being within the scope of this invention.

It should be noted that the chemical etching step to preform cavity 46 can be replaced by a conventional photoresist application step. In this instance, insulating layer 45 is coated with an insulating photosensitive material (not shown on the figure). Said material is photographically treated in the conventional manner and then removed to expose a part of layer 45 defining the cavity 46 to be etched. The sputtering step is then carried out, the exposed parts of insulating layer 45 being removed by sputter etching while the covered parts are protected by the photosensitive material. Sputtering is completed when the whole surface of the cavity bottom is in contact with the first level metal layer and the evaporation step as defined may be commenced.

While the invention has been particularly shown and described with reference to the preferred embodiment thereof, it will be understood by those skilled in the art that various changes in form and details may be made therein without departing from the spirit and scope of the invention as hereinafter claimed.

What is claimed is:

1. R. F. sputtering apparatus for etching the surface of an object, said apparatus comprising; a vacuum chamber; means to create a vacuum in said chamber; and means to supply an ionizable gas into said chamber; an R. F. power supply having at least first and second terminals; an electrode in said chamber connected to the first terminal of said supply; said electrode comprising a plate, having at least one object holder extending through said plate, and means on each said holder for holding an object to be etched; said object being supported a distance "$h$" from said plate wherein "$h$"$\geq 2$ "$e$", "$e$" being the thickness of the dark space area adjacent said object to be etched during operation of said apparatus; whereby ion bombardment of said electrode during the sputtering operation is inhibited.

2. Apparatus in accordance with claim 1 including an object support composed of an insulating material superimposed of said object in said holder, and wherein said object support has a pair of parallel surfaces approximately parallel to said electrode and on opposite sides thereof.

3. Apparatus in accordance with claim 1 including a plurality of object holders extending through said plate for supporting a plurality of objects, said holders positioned relative to one another so that when said objects to be etched are supported by said holder, said objects are spaced one from the other by a distance "$d$" wherein "$d$"$\leq 2$"$e$".

4. Apparatus in accordance with claim 3 including a plurality of apertures in said plate intermediate said holders.

5. Apparatus in accordance with claim 1 including a plurality of object holders extending through said plate for supporting a plurality of objects, and a plurality of apertures in said plate intermediate said holders.

6. Apparatus in accordance with claim 1 including a screen circumscribing said plate whereby object holders adjacent the periphery of said plate are inhibited against ion bombardment.

7. Apparatus in accordance with claim 1 including an evaporation material source in said chamber, and a shutter for masking said material during the sputter etching operation.

8. A method of etching and evaporating material on a semiconductor wafer in R.F. sputtering apparatus, said apparatus comprising a vacuum chamber and means to create an ionizable gas pressure in said chamber, an R.F. power supply having at least first and second terminals, one of the terminals being connected to a cathode electrode in said chamber, said cathode electrode comprising a plate having a plurality of semiconductor wafer supports extending through the plate, and means on the support for holding a semiconductor wafer to be etched; a heated source of material in said chamber and a shutter in said chamber intermediate said cathode electrode and said evaporation material; comprising the steps of: energizing said R.F. power supply and forming a luminescent discharge area including a Crooks dark space area having a thickness "$e$" spaced from said wafers being etched and supporting said objects a distance "$h$" from said cathode plate wherein "$h$"$\geq 2$"$e$"; sputter etching semiconductor wafers in said holders with said shutter masking said evaporation material, and thereafter evaporating said evaporation material on to said sputter etched wafer by unmasking said evaporation source.

9. A process in accordance with claim 8 including chemically etching said semiconductor wafer prior to said sputter etching step to remove at least some parts of the surface of said semiconductor wafer, and thereafter sputter etching to remove additional material from said previously chemically etched portion of said wafer.

10. A method of etching and evaporating material on an object in R. F. sputtering apparatus, said apparatus comprising a vacuum chamber and means to create an ionizable gas pressure in said chamber, an R. F. power supply having at least first and second terminals, one of the terminals being connected to a cathode electrode in said chamber, said cathode electrode comprising a plate having a plurality of object holders extending through the plate, and means on the holder for holding an object to be etched; a heated source of material in said chamber and a shutter in said chamber intermediate said cathode electrode and said evaporation material; comprising the steps of: energizing said R. F. power supply and forming a luminescent discharge area including a Crooks dark space area having a thickness "$e$" spaced from said wafers being etched and supporting said objects a distance "$h$" from said cathode plate wherein "$h$"$\geq 2$"$e$"; sputter etching objects in said holders with said shutter masking said evaporation material, and thereafter evaporating said evaporation material on to said sputter etched object by unmasking said evaporation source.

11. A process in accordance with claim 10 including chemically etching said object prior to said sputter etching step to remove at least some parts of the surface of said object, and thereafter sputter etching to remove additional material from said previously chemically etched portion of said object.

* * * * *